United States Patent
Trickett et al.

(10) Patent No.: US 6,875,477 B2
(45) Date of Patent: Apr. 5, 2005

(54) METHOD FOR COATING INTERNAL SURFACE OF PLASMA PROCESSING CHAMBER

(75) Inventors: Douglas M. Trickett, Kudamatsu (JP); Muneo Furuse, Kudamatsu (JP)

(73) Assignee: Hitachi High-Technologies Corporation, Tokyo (JP)

(*) Notice: Subject to any disclaimer, the term of this patent is extended or adjusted under 35 U.S.C. 154(b) by 0 days.

(21) Appl. No.: 10/376,304

(22) Filed: Mar. 3, 2003

(65) Prior Publication Data

US 2004/0151841 A1 Aug. 5, 2004

(51) Int. Cl.[7] .................................................. C23C 4/10
(52) U.S. Cl. ...................................... 427/454; 427/453
(58) Field of Search ................................. 427/454, 453

(56) References Cited

U.S. PATENT DOCUMENTS 6,261,643 B1 * 7/2001 Hasz et al. .............. 427/419.1

2002/0018902 A1 * 2/2002 Tsukatani et al. ........... 428/469
2002/0177001 A1 * 11/2002 Harada et al. .............. 428/469

FOREIGN PATENT DOCUMENTS

| JP | 2001-164354 | 6/2001 |
| JP | 2001-179080 | 7/2001 |

* cited by examiner

Primary Examiner—Katherine Bareford
(74) Attorney, Agent, or Firm—Antonelli, Terry, Stout & Kraus, LLP

(57) ABSTRACT

The present invention comprises an aluminum base material 2 constituting the plasma processing chamber of the plasma processing apparatus, a bonding layer 3 deposited on the base material consisting of a transition metal or transition metal alloy that modifies the difference in thermal expansion coefficient of the base material and the material constituting a plasma contact surface, and the plasma contact surface 1 formed of a material selected from a group consisting of $La_2O_3$, $LaAlO_3$, $MgLaAl_{11}O_{19}$, and a mixture of $La_2O_3$ and $Al_2O_3$ being a metal oxide including at least La and O deposited on the bonding layer 3 via a thermal spray process.

7 Claims, 2 Drawing Sheets

METHOD FOR COATING INTERNAL SURFACE OF PLASMA PROCESSING CHAMBER

FIELD OF THE INVENTION

The present invention relates to a method for coating an internal surface of a plasma processing chamber, and especially relates to a method for treating the internal surface of the plasma processing chamber so that the exposed surface that comes in contact with plasma demonstrates a superior resistance to plasmas.

DESCRIPTION OF THE RELATED ART

A prior art method for treating the surface of the plasma processing chamber comprises spraying $Y_2O_3$ on the internal surfaces of the plasma processing chamber to enhance the resistance of the exposed surface to plasmas, and disposing an undercoat containing Ni—Al and the like so as to enhance the strength of the $Y_2O_3$ film formed as a topcoat (refer for example to patent document 1).

The prior art method mentioned above does not consider the influence of the heat provided to the internal surfaces of the processing chamber, and if the surfaces are subjected to thermal cycling, the sprayed film may crack by the heat. In other words, the thermal expansion rate of the material being coated on the internal surface of the processing chamber differs greatly from the thermal expansion rate of the processing chamber, but according to the prior art, there is no transition material disposed between the two materials to modify the thermal stress.

Another prior art example proposes forming internal surfaces of the processing chamber with $Y_2O_3$ having a purity of 99.5% or more to thereby prevent metal contamination, but if the surfaces are exposed to plasmas, cracks are formed to the surfaces due to thermal cycling. Thereby, the base material (the material forming the processing chamber) comes in contact with plasmas, causing contamination of the wafer etc. being processed in the chamber (refer for example to patent document 2).

None of the prior art examples for treating the internal surfaces of the plasma processing chamber consider the mismatch in thermal expansion of the base material, the middle layer and the surface layer. The temperature in the processing vessel of the etching chamber is substantially 100° C. or lower, but the difference in temperature of the surface coming in contact with plasmas is not considered. When a conventional aluminum chamber is used as the etching process chamber, the surface of the chamber is typically anodized. When this chamber comes into contact with plasma, the anodized aluminum surface cracks due to the large difference in thermal expansion between aluminum and the anodization. As a result, the aluminum material is exposed to process gas via the cracks formed to the anodized film, and corrosion occurs at the interface between the aluminum material and anodization. As the corrosion progresses, the anodized layer exfoliates and contaminates the chamber, producing defect in the processed device.

In order to overcome such disadvantages, the prior art example disclosed in patent document 1 proposes forming a $Y_2O_3$ film on the internal surfaces of the plasma processing chamber by thermal spraying, sputtering, CVD and so on. The film thus formed demonstrates thermal resistance, but the thermal expansion coefficient of the film is extremely small compared to the base aluminum material. The example disclosed in patent document 1 disposes an undercoated middle layer formed for example of Ni—Al between the $Y_2O_3$ layer and the aluminum base, but it does not modify the thermal expansion caused by the plasma heat.

Patent Document 1
Japanese Patent Laid-Open Publication No. 2001-164354
Patent Document 2
Japanese Patent Laid-Open Publication No. 2001-179080

SUMMARY OF THE INVENTION

In order to overcome the problems of the prior art mentioned above, the present invention provides a method for forming an internal surface of a plasma processing chamber that demonstrates superior resistance to plasma processing and thus does not cause metal contamination caused by surface wear, comprising disposing a film containing $La_2O_3$ on the surface that comes into contact with plasma, and providing an undercoat layer having a graded thermal expansion so as to minimize mismatch in thermal expansion between $La_2O_3$ and aluminum material.

The above object is achieved by providing a film formed of a material containing $La_2O_3$ on a surface coming into contact with plasmas. Furthermore, the above object is achieved by providing a $La_2O_3$ film or a film formed of a mixture of $La_2O_3$ and $Al_2O_3$ as plasma contact surface, and a layer consisting of a material having a thermal expansion coefficient in-between those of the plasma contact surface and the base aluminum material.

DETAILED DESCRIPTION OF THE PREFERRED EMBODIMENTS

According to the present invention, the surface of the plasma processing chamber that comes into contact with plasmas is covered with a film formed of $La_2O_3$ or of a mixture of $La_2O_3$ and $Al_2O_3$, so as to reduce the amount of particles and other contamination caused by the surface film being damaged by plasmas. However, the thermal expansion coefficient of the surface film formed of $La_2O_3$ or of a mixture of $La_2O_3$ and $Al_2O_3$ differs greatly from the thermal expansion coefficient of the base material formed for example of aluminum and SUS.

According to the plasma processing apparatus of the present invention, a middle layer is disposed between the base material and the surface film formed of $La_2O_3$ or of a mixture of $La_2O_3$ and $Al_2O_3$ of the plasma processing chamber, thereby preventing cracks from being generated to the surface film formed of $La_2O_3$ or of a mixture of $La_2O_3$ and $Al_2O_3$.

According to the present plasma processing apparatus, the internal surface of the processing chamber is formed as explained in the following examples 1 through 38, by which no cracks are generated to the film formed of $La_2O_3$ or a mixture of $La_2O_3$ and $Al_2O_3$. Thus, the underlying base material of the processing chamber will not be exposed to process gas, and the generation of particles and contamination is thereby prevented.

The present method for coating the internal surface of the plasma processing chamber, and the structures of the plasma contact film formed according to the present method are explained in the following.

[First Embodiment]

Figure 1:
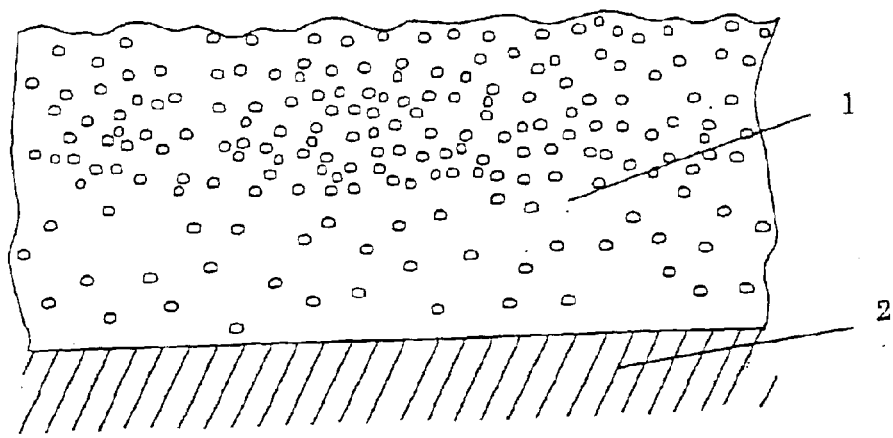
FIG. 1 is a cross-sectional view showing a surface structure of the plasma processing chamber according to a first embodiment of the present invention.

As shown in FIG. 1, the present embodiment comprises depositing on a surface of an aluminum base material 2 constituting the plasma processing chamber of the plasma processing apparatus the plasma contact surface 1 formed of a metal oxide including at least La and O via a thermal spray process. According to the present embodiment, the plasma contact surface 1 is formed of a material selected from a group consisting of $La_2O_3$, $LaAlO_3$, $MgLaAl_{11}O_{19}$, and a mixture of $La_2O_3$ and $Al_2O_3$. The base material 2 is formed of aluminum.

EXAMPLE 1

$La_2O_3$ is deposited on a surface of an aluminum base material constituting the plasma processing chamber of the plasma processing apparatus via the thermal spray process to form the plasma contact surface. The $La_2O_3$ film is a single layer coating having a thickness of 5 $\mu$m to 3000 $\mu$m with a porosity between 15% and 50%.

EXAMPLE 2

$LaAlO_3$ is deposited on the surface of an aluminum base material constituting a plasma processing chamber of the plasma processing apparatus via a thermal spray process to form the plasma contact surface. The $LaAlO_3$ film is a single layer coating having a thickness of 5 $\mu$m to 3000 $\mu$m with a porosity between 15% and 50%.

EXAMPLE 3

$MgLaAl_{11}O_{19}$ is deposited on a surface of an aluminum base material constituting the plasma processing chamber of the plasma processing apparatus via a thermal spray process to form the plasma contact surface. The $MgLaAl_{11}O_{19}$ film is a single layer coating having a thickness of 5 $\mu$m to 3000 $\mu$m with a porosity between 15% and 50%.

EXAMPLE 4

A mixture of $La_2O_3$+$AlO_3$ is deposited on a surface of an aluminum base material constituting the plasma processing chamber of the plasma processing apparatus via a thermal spray process to form the plasma contact surface. The $La_2O_3$+$AlO_3$ mixture film is a single layer coating having a thickness of 5 $\mu$m to 3000 $\mu$m with a porosity between 15% and 50%.

[Second Embodiment]

Figure 2:
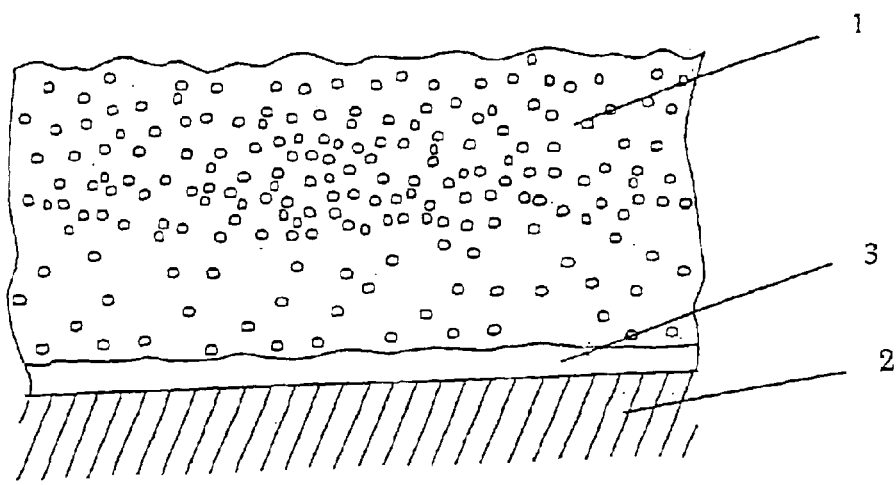
FIG. 2 is a cross-sectional view showing a surface structure of the plasma processing chamber according to a second embodiment of the present invention.

As shown in FIG. 2, the second embodiment comprises an aluminum base material 2 constituting the plasma processing chamber of the plasma processing apparatus, a bonding layer 3 deposited on the base material consisting of a transition metal or transition metal alloy that modifies the difference or mismatch in thermal expansion coefficient of the base material and the material constituting the plasma contact surface, and the plasma contact surface 1 formed of the metal oxide including at least La and O deposited on the bonding layer 3 via a thermal spray process. According to the present embodiment, the plasma contact surface 1 is formed of a material selected from a group consisting of $La_2O_3$, $LaAlO_3$, $MgLaAl_{11}O_{19}$, and a mixture of $La_2O_3$ and $Al_2O_3$. The bonding layer 3 consists of a transition metal or a transition metal alloy, and the base material 2 is formed of aluminum. The thermal expansion coefficient of the transition metal or transition alloy is in-between that of the base material and that of the coating material.

EXAMPLE 5

This example comprises an aluminum base material constituting the plasma processing chamber of the plasma processing apparatus, a bonding layer consisting of a transition metal or transition metal alloy of 5 $\mu$m to 150 $\mu$m in thickness being deposited on the base material via a thermal spray process, and the plasma contact surface formed of $La_2O_3$ deposited on the bonding layer via a thermal spray process. The bonding layer demonstrates superior adhesion to both the base material and top surface layer, and consists of a material having a thermal expansion coefficient similar to that of Al, such as an alloy including $ZrO_2$. The plasma contact surface formed of $La_2O_3$ is a single layer coating having a thickness of 5 $\mu$m to 3000 $\mu$m with a porosity between 15% and 50%.

EXAMPLE 6

This example comprises an aluminum base material constituting the plasma processing chamber of the plasma processing apparatus, a bonding layer consisting of a transition metal or transition metal alloy of 5 $\mu$m to 150 $\mu$m in thickness being deposited on the base material via a thermal spray process, and the plasma contact surface formed of $LaAlO_3$ deposited on the bonding layer via a thermal spray process. The bonding layer demonstrates superior adhesion to both the base material and top surface layer, and consists of a material having a thermal expansion coefficient in-between those of the base material and the surface layer, such as material including $ZrO_2$. The plasma contact surface formed of $LaAlO_3$ is a single layer coating having a thickness of 5 $\mu$m to 3000 $\mu$m with a porosity between 15% and 50%.

EXAMPLE 7

This example comprises an aluminum base material constituting the plasma processing chamber of the plasma processing apparatus, a bonding layer consisting of a transition metal or transition metal alloy of 5 $\mu$m to 150 $\mu$m in thickness being deposited on the base material via a thermal spray process, and the plasma contact surface formed of $MgLaAl_{11}O_{19}$ deposited on the bonding layer via a thermal spray process. The bonding layer demonstrates superior adhesion to both the base material and top surface layer, and consists of a material having a thermal expansion coefficient in-between those of the base material and the surface layer, such as material including $ZrO_2$. The plasma contact surface formed of $MgLaAl_{11}O_{19}$ is a single layer coating having a thickness of 5 $\mu$m to 3000 $\mu$m with a porosity between 15% and 50%.

EXAMPLE 8

This example comprises an aluminum base material constituting the plasma processing chamber of the plasma processing apparatus, a bonding layer consisting of a transition metal or transition metal alloy of 5 $\mu$m to 150 $\mu$m in thickness being deposited on the base material via a thermal spray process, and the plasma contact surface formed of a mixture of $La_2O_3$+$AlO_3$ deposited on the bonding layer via a thermal spray process. The bonding layer demonstrates superior adhesion to both the base material and top surface layer, and consists of a material having a thermal expansion coefficient in-between those of the base material and the surface layer, such as material including $ZrO_2$. The plasma contact surface formed of a mixture of $La_2O_3+AlO_3$ is a single layer coating having a thickness of 5 $\mu$m to 3000 $\mu$m with a porosity between 15% and 50%.

[Third Embodiment]

Figure 3:
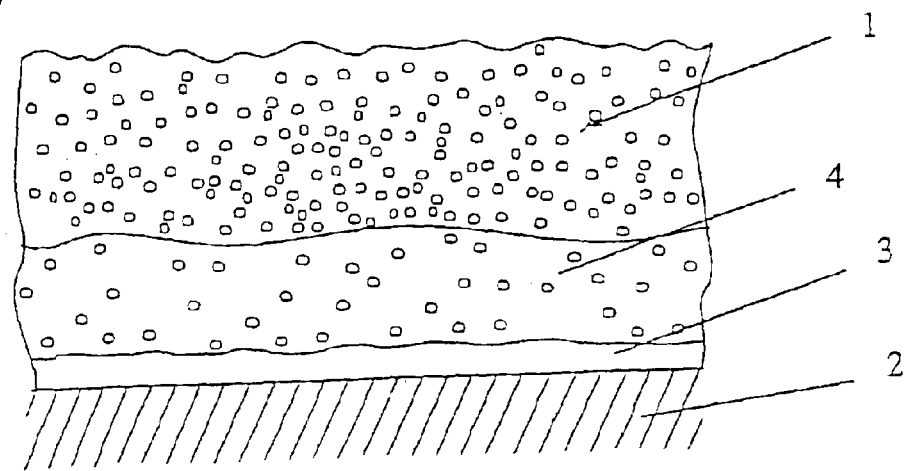
FIG. 3 is a cross-sectional view showing a surface structure of the plasma processing chamber according to a third embodiment of the present invention.

As shown in FIG. 3, the third embodiment comprises an aluminum base material 2 constituting the plasma processing chamber of the plasma processing apparatus, a bonding layer 3 deposited on the base material consisting of a transition metal or transition metal alloy, a middle layer 4 deposited on the bonding layer 3 consisting of $MgAl_2O_4$+$LaAlO_3$, $MgO+Al_2O_3+La_2O_3$, $LaAlO_3$, or $MgAl_2O_4$, and the plasma contact surface 1 formed of a metal oxide including at least La and O deposited on the middle layer via a thermal spray process. According to the present embodiment, the plasma contact surface 1 is formed of a material selected from a group consisting of $La_2O_3$, $LaAlO_3$, $MgLaAl_{11}O_{19}$, and a mixture of $La_2O_3+Al_2O_3$. The bonding layer 3 consists of a transition metal or a transition metal alloy. The middle layer 4 is selected from a group consisting of $MgAl_2O_4$+$LaAlO_3$, $MgO+Al_2O_3+La_2O_3$, $LaAlO_3$, and $MgAl_2O_4$. The base material 2 is formed of aluminum.

EXAMPLE 9

This example comprises an aluminum base material constituting the plasma processing chamber of the plasma processing apparatus, a bonding layer consisting of a transition metal or transition metal alloy of 5 $\mu$m to 150 $\mu$m in thickness being deposited on the base material via a thermal spray process, a middle layer formed of a mixture of $MgAl_2O_4$+$LaAlO_3$ having a thickness of 5 $\mu$m to 2000 $\mu$m with a porosity between 0.1% and 15% deposited on the bonding layer via a thermal spray process, and a plasma contact surface of $La_2O_3$ deposited on the middle layer via a thermal spray process. The bonding layer demonstrates superior adhesion to both the base material and top surface layer, and consists of a material having a thermal expansion coefficient in-between those of the base material and the surface layer, such as material including $ZrO_2$. The plasma contact surface formed of $La_2O_3$ is a single layer coating having a thickness of 5 $\mu$m to 3000 $\mu$m with a porosity between 15% and 50%.

EXAMPLE 10

This example comprises an aluminum base material constituting the plasma processing chamber of the plasma processing apparatus, a bonding layer consisting of a transition metal or transition metal alloy of 5 $\mu$m to 150 $\mu$m in thickness being deposited on the base material via a thermal spray process, a middle layer formed of a mixture of $MgAl_2O_4$+$LaAlO_3$ having a thickness of 5 $\mu$m to 2000 $\mu$m with a porosity between 0.1% and 15% deposited on the bonding layer via a thermal spray process, and a plasma contact surface of $LaAlO_3$ deposited on the middle layer via a thermal spray process. The bonding layer demonstrates superior adhesion to both the base material and top surface layer, and consists of a material having a thermal expansion coefficient in-between those of the base material and the surface layer, such as material including $ZrO_2$. The plasma contact surface formed of $LaAlO_3$ is a single layer coating having a thickness of 5 $\mu$m to 3000 $\mu$m with a porosity between 15% and 50%.

EXAMPLE 11

This example comprises an aluminum base material constituting a plasma processing chamber of a plasma processing apparatus, a bonding layer consisting of a transition metal or transition metal alloy of 5 $\mu$m to 150 $\mu$m in thickness being deposited on the base material via a thermal spray process, a middle layer formed of a mixture of $MgAl_2O_4$+$LaAlO_3$ having a thickness of 5 $\mu$m to 2000 $\mu$m with a porosity between 0.1% and 15% deposited on the bonding layer via a thermal spray process, and a plasma contact surface of $MgLaAl_{11}O_{19}$ deposited on the middle layer via a thermal spray process. The bonding layer demonstrates superior adhesion to both the base material and top surface layer, and consists of a material having a thermal expansion coefficient in-between those of the base material and the surface layer, such as material including $ZrO_2$. The plasma contact surface formed of $MgLaAl_{11}O_{19}$ is a single layer coating having a thickness of 5 $\mu$m to 3000 $\mu$m with a porosity between 15% and 50%.

EXAMPLE 12

This example comprises an aluminum base material constituting a plasma processing chamber of a plasma processing apparatus, a bonding layer consisting of a transition metal or transition metal alloy of 5 $\mu$m to 150 $\mu$m in thickness being deposited on the base material via a thermal spray process, a middle layer formed of a mixture of $MgAl_2O_4$+$LaAlO_3$ having a thickness of 5 $\mu$m to 2000 $\mu$m with a porosity between 0.1% and 15% deposited on the bonding layer via a thermal spray process, and a plasma contact surface formed of a mixture of $La_2O_3+Al_2O_3$ deposited on the middle layer via a thermal spray process. The bonding layer demonstrates superior adhesion to both the base material and top surface layer, and consists of a material having a thermal expansion coefficient in-between those of the base material and the surface layer, such as material including $ZrO_2$. The plasma contact surface formed of a mixture of $La_2O_3+Al_2O_3$ is a single layer coating having a thickness of 5 $\mu$m to 3000 $\mu$m with a porosity between 15% and 50%.

EXAMPLE 13

This example comprises an aluminum base material constituting the plasma processing chamber of the plasma processing apparatus, a bonding layer consisting of a transition metal or transition metal alloy of 5 $\mu$m to 150 $\mu$m in thickness being deposited on the base material via a thermal spray process, a middle layer formed of a mixture of $MgO+Al_2O_3+La_2O_3$ having a thickness of 5 $\mu$m to 2000 $\mu$m with a porosity between 0.1% and 15% deposited on the bonding layer via a thermal spray process, and a plasma contact surface formed of $La_2O_3$ deposited on the middle layer via a thermal spray process. The bonding layer demonstrates superior adhesion to both the base material and top surface layer, and consists of a material having a thermal expansion coefficient in-between those of the base material and the surface layer, such as material including $ZrO_2$. The plasma contact surface formed of $La_2O_3$ is a single layer coating having a thickness of 5 $\mu$m to 3000 $\mu$m with a porosity between 15% and 50%.

EXAMPLE 14

This example comprises an aluminum base material constituting the plasma processing chamber of the plasma processing apparatus, a bonding layer consisting of a transition metal or transition metal alloy of 5 μm to 150 μm in thickness being deposited on the base material via a thermal spray process, a middle layer formed of a mixture of $MgO+Al_2O_3+La_2O_3$ having a thickness of 5 μm to 2000 μm with a porosity between 0.1% and 15% deposited on the bonding layer via a thermal spray process, and a plasma contact surface formed of $LaAlO_3$ deposited on the middle layer via a thermal spray process. The bonding layer demonstrates superior adhesion to both the base material and top surface layer, and consists of a material having a thermal expansion coefficient in-between those of the base material and the surface layer, such as material including $ZrO_2$. The plasma contact surface formed of $LaAlO_3$ is a single layer coating having a thickness of 5 μm to 3000 μm with a porosity between 15% and 50%.

EXAMPLE 15

This example comprises an aluminum base material constituting the plasma processing chamber of the plasma processing apparatus, a bonding layer consisting of a transition metal or transition metal alloy of 5 μm to 150 μm in thickness being deposited on the base material via a thermal spray process, a middle layer formed of a mixture of $MgO+Al_2O_3+La_2O_3$ having a thickness of 5 μm to 2000 μm with a porosity between 0.1% and 15% deposited on the bonding layer via a thermal spray process, and a plasma contact surface formed of $MgLaAl_{11}O_{19}$ deposited on the middle layer via a thermal spray process. The bonding layer demonstrates superior adhesion to both the base material and top surface layer. The plasma contact surface formed of $MgLaAl_{11}O_{19}$ is a single layer coating having a thickness of 5 μm to 3000 μm with a porosity between 15% and 50%.

EXAMPLE 16

This example comprises an aluminum base material constituting the plasma processing chamber of the plasma processing apparatus, a bonding layer consisting of a transition metal or transition metal alloy of 5 μm to 150 μm in thickness being deposited on the base material via a thermal spray process, a middle layer formed of a mixture of $MgO+Al_2O_3+La_2O_3$ having a thickness of 5 μm to 2000 μm with a porosity between 0.1% and 15% deposited on the bonding layer via a thermal spray process, and a plasma contact surface formed of a mixture of $La_2O_3+Al_2O_3$ deposited on the middle layer via a thermal spray process. The bonding layer demonstrates superior adhesion to both the base material and top surface layer, and consists of a material having a thermal expansion coefficient in-between those of the base material and the surface layer, such as material including $ZrO_2$. The plasma contact surface formed of a mixture of $La_2O_3+Al_2O_3$ is a single layer coating having a thickness of 5 μm to 3000 μm with a porosity between 15% and 50%.

EXAMPLE 17

This example comprises an aluminum base material constituting the plasma processing chamber of the plasma processing apparatus, a bonding layer consisting of a transition metal or transition metal alloy of 5 μm to 150 μm in thickness being deposited on the base material via a thermal spray process, a middle layer formed of $LaAlO_3$ having a thickness of 5 μm to 2000 μm with a porosity between 0.1% and 15% deposited on the bonding layer via a thermal spray process, and a plasma contact surface formed of $La_2O_3$ deposited on the middle layer via a thermal spray process. The bonding layer demonstrates superior adhesion to both the base material and top surface layer, and consists of a material having a thermal expansion coefficient in-between those of the base material and the surface layer, such as material including $ZrO_2$. The plasma contact surface formed of $La_2O_3$ is a single layer coating having a thickness of 5 μm to 3000 μm with a porosity between 15% and 50%.

EXAMPLE 18

This example comprises an aluminum base material constituting the plasma processing chamber of the plasma processing apparatus, a bonding layer consisting of a transition metal or transition metal alloy of 5 μm to 150 μm in thickness being deposited on the base material via a thermal spray process, a middle layer formed of $LaAlO_3$ having a thickness of 5 μm to 2000 μm with a porosity between 0.1% and 15% deposited on the bonding layer via a thermal spray process, and a plasma contact surface formed of $MgLaAl_{11}O_{19}$ deposited on the middle layer via a thermal spray process. The bonding layer demonstrates superior adhesion to both the base material and top surface layer, and consists of a material having a thermal expansion coefficient in-between those of the base material and the surface layer, such as material including $ZrO_2$. The plasma contact surface formed of $MgLaAl_{11}O_{19}$ is a single layer coating having a thickness of 5 μm to 3000 μm with a porosity between 15% and 50%.

EXAMPLE 19

This example comprises an aluminum base material constituting the plasma processing chamber of the plasma processing apparatus, a bonding layer consisting of a transition metal or transition metal alloy of 5 μm to 150 μm in thickness being deposited on the base material via a thermal spray process, a middle layer formed of $LaAlO_3$ having a thickness of 5 μm to 2000 μm with a porosity between 0.1% and 15% deposited on the bonding layer via a thermal spray process, and a plasma contact surface formed of a mixture of $La_2O_3+Al_2O_3$ deposited on the middle layer via a thermal spray process. The bonding layer demonstrates superior adhesion to both the base material and top surface layer, and consists of a material having a thermal expansion coefficient in-between those of the base material and the surface layer, such as material including $ZrO_2$. The plasma contact surface formed of a mixture of $La_2O_3+Al_2O_3$ is a single layer coating having a thickness of 5 μm to 3000 μm with a porosity between 15% and 50%.

EXAMPLE 20

This example comprises an aluminum base material constituting the plasma processing chamber of the plasma processing apparatus, a bonding layer consisting of a transition metal or transition metal alloy of 5 μm to 150 μm in thickness being deposited on the base material via a thermal spray process, a middle layer formed of $MgAl_2O_4$ having a thickness of 5 μm to 2000 μm with a porosity between 0.1% and 15% deposited on the bonding layer via a thermal spray process, and a plasma contact surface formed of $La_2O_3$ deposited on the middle layer via a thermal spray process. The bonding layer demonstrates superior adhesion to both the base material and top surface layer, and consists of a material having a thermal expansion coefficient in-between those of the base material and the surface layer, such as material including $ZrO_2$. The plasma contact surface formed of $La_2O_3$ is a single layer coating having a thickness of 5 μm to 3000 μm with a porosity between 15% and 50%.

EXAMPLE 21

This example comprises an aluminum base material constituting the plasma processing chamber of the plasma processing apparatus, a bonding layer consisting of a transition metal or transition metal alloy of 5 μm to 150 μm in thickness being deposited on the base material via a thermal spray process, a middle layer formed of $MgAl_2O_4$ having a thickness of 5 μm to 2000 μm with a porosity between 0.1% and 15% deposited on the bonding layer via a thermal spray process, and a plasma contact surface formed of $LaAlO_3$ deposited on the middle layer via a thermal spray process. The bonding layer demonstrates superior adhesion to both the base material and top surface layer, and consists of a material having a thermal expansion coefficient in-between those of including $ZrO_2$. The plasma contact surface formed of $LaAlO_3$ is a single layer coating having a thickness of 5 μm to 3000 μm with a porosity between 15% and 50%.

EXAMPLE 22

This example comprises an aluminum base material constituting the plasma processing chamber of the plasma processing apparatus, a bonding layer consisting of a transition metal or transition metal alloy of 5 μm to 150 μm in thickness being deposited on the base material via a thermal spray process, a middle layer formed of $MgAl_2O_4$ having a thickness of 5 μm to 2000 μm with a porosity between 0.1% and 15% deposited on the bonding layer via a thermal spray process, and a plasma contact surface formed of $MgLaAl_{11}O_{19}$ deposited on the middle layer via a thermal spray process. The bonding layer demonstrates superior adhesion to both the base material and top surface layer, and consists of a material having a thermal expansion coefficient in-between those of the base material and the surface layer, such as material including $ZrO_2$. The plasma contact surface formed of $MgLaAl_{11}O_{19}$ is a single layer coating having a thickness of 5 μm to 3000 μm with a porosity between 15% and 50%.

EXAMPLE 23

This example comprises an aluminum base material constituting the plasma processing chamber of the plasma processing apparatus, a bonding layer consisting of a transition metal or transition metal alloy of 5 μm to 150 μm in thickness being deposited on the base material via a thermal spray process, a middle layer formed of $MgAl_2O_4$ having a thickness of 5 μm to 2000 μm with a porosity between 0.1% and 15% deposited on the bonding layer via a thermal spray process, and a plasma contact surface formed of a mixture of $La_2O_3+Al_2O_3$ deposited on the middle layer via a thermal spray process. The bonding layer demonstrates superior adhesion to both the base material and top surface layer, and consists of a material having a thermal expansion coefficient in-between those of the base material and the surface layer, such as material including $ZrO_2$. The plasma contact surface formed of a mixture of $La_2O_3+Al_2O_3$ is a single layer coating having a thickness of 5 μm to 3000 μm with a porosity between 15% and 50%.

EXAMPLE 24

This example comprises an aluminum base material constituting the plasma processing chamber of the plasma processing apparatus, a bonding layer consisting of a transition metal or transition metal alloy of 5 μm to 150 μm in thickness being deposited on the base material via a thermal spray process, a middle layer formed of a mixture of $MgAl_2O_4+LaAlO_3$ having a thickness of 5 μm to 2000 μm with a porosity between 0.1% and 15% deposited on the bonding layer via a thermal spray process, and a plasma contact surface formed of $La_2O_3$ deposited on the middle layer via a thermal spray process. The bonding layer demonstrates superior adhesion to both the base material and top surface layer, and consists of a material having a thermal expansion coefficient in-between those of the base material and the surface layer, such as material including $ZrO_2$. The plasma contact surface formed of $La_2O_3$ is a single layer coating having a thickness of 5 μm to 3000 μm with a porosity between 15% and 50%.

EXAMPLE 25

This example comprises an aluminum base material constituting the plasma processing chamber of the plasma processing apparatus, a bonding layer consisting of a transition metal or transition metal alloy of 5 μm to 150 μm in thickness being deposited on the base material via a thermal spray process, a middle layer formed of a mixture of $MgAl_2O_4+LaAlO_3$ having a thickness of 5 μm to 2000 μm with a porosity between 0.1% and 15% deposited on the bonding layer via a thermal spray process, and a plasma contact surface formed of $LaAlO_3$ deposited on the middle layer via a thermal spray process. The bonding layer demonstrates superior adhesion to both the base material and top surface layer, and consists of a material having a thermal expansion coefficient in-between those of the base material and the surface layer, such as material including $ZrO_2$. The plasma contact surface formed of $LaAlO_3$ is a single layer coating having a thickness of 5 μm to 3000 μm with a porosity between 15% and 50%.

EXAMPLE 26

This example comprises an aluminum base material constituting the plasma processing chamber of the plasma processing apparatus, a bonding layer consisting of a transition metal or transition metal alloy of 5 μm to 150 μm in thickness being deposited on the base material via a thermal spray process, a middle layer formed of a mixture of $MgAl_2O_4+LaAlO_3$ having a thickness of 5 μm to 2000 μm with a porosity between 0.1% and 15% deposited on the bonding layer via a thermal spray process, and a plasma contact surface formed of $MgLaAl_{11}O_{19}$ deposited on the middle layer via a thermal spray process. The bonding layer demonstrates superior adhesion to both the base material and top surface layer, and consists of a material having a thermal expansion coefficient in-between those of the base material and the surface layer, such as material including $ZrO_2$. The plasma contact surface formed of $MgLaAl_{11}O_{19}$ is a single layer coating having a thickness of 5 μm to 3000 μm with a porosity between 15% and 50%.

EXAMPLE 27

This example comprises an aluminum base material constituting the plasma processing chamber of the plasma processing apparatus, a bonding layer consisting of a transition metal or transition metal alloy of 5 μm to 150 μm in thickness being deposited on the base material via a thermal spray process, a middle layer formed of a mixture of $MgAl_2O_4+LaAlO_3$ having a thickness of 5 μm to 2000 μm with a porosity between 0.1% and 15% deposited on the bonding layer via a thermal spray process, and a plasma contact surface formed of a mixture of $La_2O_3+Al_2O_3$ deposited on the middle layer via a thermal spray process. The bonding layer demonstrates superior adhesion to both the base material and top surface layer, and consists of a material having a thermal expansion coefficient in-between those of the base material and the surface layer, such as material containing $ZrO_2$. The plasma contact surface formed of a mixture of $La_2O_3+Al_2O_3$ is a single layer coating having a thickness of 5 μm to 3000 μm with a porosity between 15% and 50%.

[Fourth Embodiment]

Figure 4:
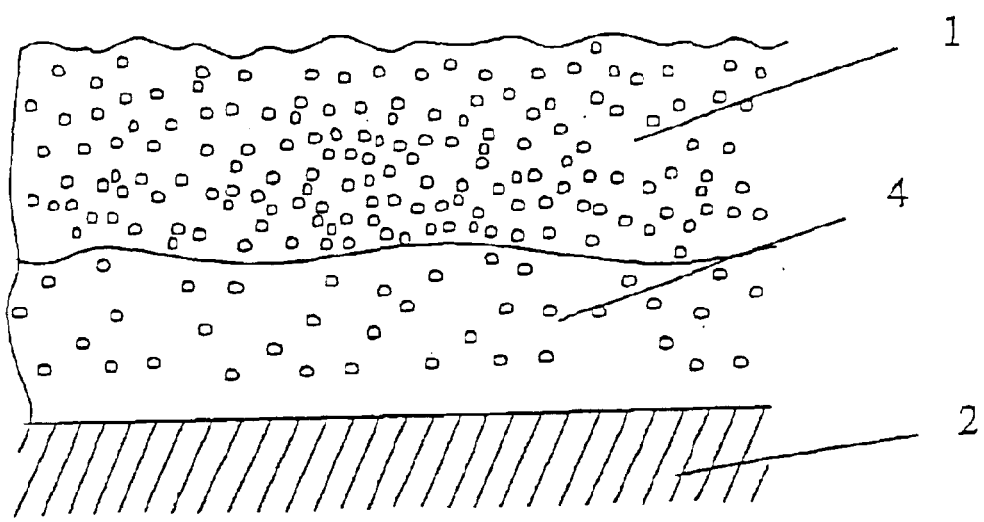
FIG. 4 is a cross-sectional view showing a surface structure of the plasma processing chamber according to a fourth embodiment of the present invention.

As shown in FIG. 4, the fourth embodiment comprises an aluminum base material 2 constituting the plasma processing chamber of the plasma processing apparatus, a middle layer 4 deposited on the aluminum base material 2 consisting of $MgO+Al_2O_3+La_2O_3$, $MgAl_2O_4+LaAlO_3$, $LaAlO_3$, or $MgAl_2O_4$, and a plasma contact surface 1 formed of a metal oxide including at least La and O deposited on the middle layer via a thermal spray process. According to the present embodiment, the plasma contact surface 1 is formed of a material selected from a group consisting of $La_2O_3$, $LaAlO_3$, $MgLaAl_{11}O_{19}$, and a mixture of $La_2O_3+Al_2O_3$. The middle layer 4 is selected from a group consisting of $MgO+Al_2O_3+La_2O_3$, $MgAl_2O_4+LaAlO_3$, $LaAlO_3$, or $MgAl_2O_4$. The base material 2 is formed of aluminum.

EXAMPLE 28

This example comprises an aluminum base material constituting the plasma processing chamber of the plasma processing apparatus, a middle layer formed of a mixture of $MgO+Al_2O_3+La_2O_3$ having a thickness of 5 μm to 2000 μm with a porosity between 0.1% and 15% deposited on the base material via a thermal spray process, and a plasma contact surface formed of $La_2O_3$ deposited on the middle layer via a thermal spray process. The plasma contact surface formed of $La_2O_3$ is a single layer coating having a thickness of 5 μm to 3000 μm with a porosity between 15% and 50%.

EXAMPLE 29

This example comprises an aluminum base material constituting the plasma processing chamber of the plasma processing apparatus, a middle layer formed of a mixture of $MgO+Al_2O_3+La_2O_3$ having a thickness of 5 μm to 2000 μm with a porosity between 0.1% and 15% deposited on the base material via a thermal spray process, and a plasma contact surface formed of $LaAlO_3$ deposited on the middle layer via a thermal spray process. The plasma contact surface formed of $LaAlO_3$ is a single layer coating having a thickness of 5 μm to 3000 μm with a porosity between 15% and 50%.

EXAMPLE 30

This example comprises an aluminum base material constituting the plasma processing chamber of the plasma processing apparatus, a middle layer formed of a mixture of $MgO+Al_2O_3+La_2O_3$ having a thickness of 5 μm to 2000 μm with a porosity between 0.1% and 15% deposited on the base material via a thermal spray process, and a plasma contact surface formed of $MgLaAl_{11}O_{19}$ deposited on the middle layer via a thermal spray process. The plasma contact surface formed of $MgLaAl_{11}O_{19}$ is a single layer coating having a thickness of 5 μm to 3000 μm with a porosity between 15% and 50%.

EXAMPLE 31

This example comprises an aluminum base material constituting the plasma processing chamber of the plasma processing apparatus, a middle layer formed of a mixture of $MgO+Al_2O_3+La_2O_3$ having a thickness of 5 μm to 2000 μm with a porosity between 0.1% and 15% deposited on the base material via a thermal spray process, and a plasma contact surface formed of a mixture of $La_2O_3+Al_2O_3$ deposited on the middle layer via a thermal spray process. The plasma contact surface formed of $La_2O_3+Al_2O_3$ is a single layer coating having a thickness of 5 μm to 3000 μm with a porosity between 15% and 50%.

EXAMPLE 32

This example comprises an aluminum base material constituting the plasma processing chamber of the plasma processing apparatus, a middle layer formed of $LaAlO_3$ having a thickness of 5 μm to 2000 μm with a porosity between 0.1% and 15% deposited on the base material via a thermal spray process, and a plasma contact surface formed of $La_2O_3$ deposited on the middle layer via a thermal spray process. The plasma contact surface formed of $La_2O_3$ is a single layer coating having a thickness of 5 μm to 3000 μm with a porosity between 15% and 50%.

EXAMPLE 33

This example comprises an aluminum base material constituting the plasma processing chamber of the plasma processing apparatus, a middle layer formed of $LaAlO_3$ having a thickness of 5 μm to 2000 μm with a porosity between 0.1% and 15% deposited on the base material via a thermal spray process, and a plasma contact surface formed of $MgLaAl_{11}O_{19}$ deposited on the middle layer via a thermal spray process. The plasma contact surface formed of $MgLaAl_{11}O_{19}$ is a single layer coating having a thickness of 5 μm to 3000 μm with a porosity between 15% and 50%.

EXAMPLE 34

This example comprises an aluminum base material constituting the plasma processing chamber of the plasma processing apparatus, a middle layer formed of $LaAlO_3$ having a thickness of 5 μm to 2000 μm with a porosity between 0.1% and 15% deposited on the base material via a thermal spray process, and a plasma contact surface formed of a mixture of $La_2O_3+Al_2O_3$ deposited on the middle layer via a thermal spray process. The plasma contact surface formed of $La_2O_3+Al_2O_3$ is a single layer coating having a thickness of 5 μm to 3000 μm with a porosity between 15% and 50%.

EXAMPLE 35

This example comprises an aluminum base material constituting the plasma processing chamber of the plasma processing apparatus, a middle layer formed of $MgAl_2O_4$ having a thickness of 5 μm to 2000 μm with a porosity between 0.1% and 15% deposited on the base material via a thermal spray process, and a plasma contact surface formed of $La_2O_3$ deposited on the middle layer via a thermal spray process. The plasma contact surface formed of $La_2O_3$ is a single layer coating having a thickness of 5 μm to 3000 μm with a porosity between 15% and 50%.

EXAMPLE 36

This example comprises an aluminum base material constituting the plasma processing chamber of the plasma processing apparatus, a middle layer formed of $MgAl_2O_4$ having a thickness of 5 μm to 2000 μm with a porosity between 0.1% and 15% deposited on the base material via a thermal spray process, and a plasma contact surface formed of $LaAlO_3$ deposited on the middle layer via a thermal spray process. The plasma contact surface formed of $LaAlO_3$ is a single layer coating having a thickness of 5 μm to 3000 μm with a porosity between 15% and 50%.

EXAMPLE 37

This example comprises an aluminum base material constituting the plasma processing chamber of the plasma processing apparatus, a middle layer formed of $MgAl_2O_4$ having a thickness of 5 μm to 2000 μm with a porosity between 0.1% and 15% deposited on the base material via a thermal spray process, and a plasma contact surface formed of $MgLaAl_{11}O_{19}$ deposited on the middle layer via a thermal spray process. The plasma contact surface formed of $MgLaAl_{11}O_{19}$ is a single layer coating having a thickness of 5 μm to 3000 μm with a porosity between 15% and 50%.

EXAMPLE 38

This example comprises an aluminum base material constituting the plasma processing chamber of the plasma processing apparatus, a middle layer formed of $MgAl_2O_4$ having a thickness of 5 μm to 2000 μm with a porosity between 0.1% and 15% deposited on the base material via a thermal spray process, and a plasma contact surface formed of a mixture of $La_2O_3+Al_2O_3$ deposited on the middle layer via a thermal spray process. The plasma contact surface formed of $La_2O_3+Al_2O_3$ is a single layer coating having a thickness of 5 μm to 3000 μm with a porosity between 15% and 50%.

The $La_2O_3$ film structure applied via a thermal spray process according to examples 1, 5, 9, 13, 17, 20, 24, 28, 32 and 35 has a purity of at least 97%.

Furthermore, the $La_2O_3$ film structure according to examples 1, 5, 9, 13, 17, 20, 24, 28, 32 and 35 can be a $LaF_3$ film structure having a purity of at least 97%.

The above spray coating process should be produced in vacuum or in a noble gas atmosphere. Suitable base material for the deposition of sprayed coatings consists of the following metals and their alloys including but not limited to steels, stainless steels, aluminum, anodized aluminum, transition metals, carbon ceramics, nitride ceramics, oxide ceramics, and non-oxide ceramics.

As explained, advantageously according to the present invention, the plasma processing chamber surface has a coating layer applied thereto via a thermal spray coating and the like by which the surface coming into contact with plasma is prevented from cracking, and thus the base material constituting the chamber will not be exposed to plasmas. As a result, even when plasma processing is performed repeatedly, the plasma processing chamber will not be contaminated.

What is claimed is:

1. A method for coating an internal surface of a plasma processing chamber comprising coating a transition material on a base material constituting the plasma processing chamber, forming a middle layer by depositing a mixture of $MgAl_2O_4+LaAlO_3$ on the transition material via a thermal spray process, and forming a plasma contact surface by depositing a material selected from a group consisting of $La_2O_3$, $LaAlO_3$, $MgLaAl_{11}O_{19}$, and $La_2O_3+Al_2O_3$ on the middle layer via a thermal spray process.

2. A method for coating an internal surface of a plasma processing chamber comprising coating a transition material on a base material constituting the plasma processing chamber, forming a middle layer by depositing a mixture of $MgO+Al_2O_3+La_2O_3$ on the transition material via a thermal spray process, and forming a plasma contact surface by depositing a material selected from a group consisting of $La_2O_3$, $LaAlO_3$, $MgLaAl_{11}O_{19}$, and $La_2O_3+Al_2O_3$ on the middle layer via a thermal spray process.

3. A method for coating an internal surface of a plasma processing chamber comprising coating a transition material on a base material constituting the plasma processing chamber, forming a middle layer by depositing $LaAlO_3$ on the transition material via a thermal spray process, and forming a plasma contact surface by depositing a material selected from a group consisting of $La_2O_3$, $MgLaAl_{11}O_{19}$, and $La_2O_3+Al_2O_3$ on the middle layer via a thermal spray process.

4. A method for coating an internal surface of a plasma processing chamber comprising coating a transition material on a base material constituting the plasma processing chamber, forming a middle layer by depositing $MgAl_2O_4$ on the transition material via a thermal spray process, and forming a plasma contact surface by depositing a material selected from a group consisting of $La_2O_3$, $LaAlO_3$, $MgLaAl_{11}O_{19}$, and $La_2O_3+Al_2O_3$ on the middle layer via a thermal spray process.

5. A method for coating an internal surface of a plasma processing chamber comprising forming a middle layer by depositing a mixture of $MgO+Al_2O_3+La_2O_3$ on a base material constituting the plasma processing chamber via a thermal spray process, and forming a plasma contact surface by depositing a material selected from a group consisting of $La_2O_3$, $LaAlO_3$, $MgLaAl_{11}O_{19}$, and $La_2O_3+Al_2O_3$ on the middle layer via a thermal spray process.

6. A method for coating an internal surface of a plasma processing chamber comprising forming a middle layer by depositing $LaAlO_3$ on a base material constituting the plasma processing chamber via a thermal spray process, and forming a plasma contact surface by depositing one material selected from a group consisting of $La_2O_3$ and $La_2O_3+Al_2O_3$ on the middle layer via a thermal spray process.

7. A method for coating an internal surface of a plasma processing chamber comprising forming a middle layer by depositing $MgAl_2O_4$ on a base material of the plasma processing chamber via a thermal spray process, and forming a plasma contact surface by depositing a material selected from a group consisting of $La_2O_3$, $LaAlO_3$, $MgLaAl_{11}O_{19}$, and $La_2O_3+Al_2O_3$ on the middle layer via a thermal spray process.

* * * * *